United States Patent [19]
Lee et al.

[11] Patent Number: 5,818,091
[45] Date of Patent: Oct. 6, 1998

[54] SEMICONDUCTOR DEVICE WITH SELECTIVELY PATTERNED CONNECTION PAD LAYER FOR INCREASING A CONTACT MARGIN

[75] Inventors: Yong-hee Lee, Seoul; Young-woo Seo; Jung-hyun Shin, both of Kyungki-do, all of Rep. of Korea

[73] Assignee: Samsung Electronics Co., Ltd., Suwon, Rep. of Korea

[21] Appl. No.: 747,378

[22] Filed: Nov. 12, 1996

Related U.S. Application Data

[60] Continuation of Ser. No. 440,397, May 15, 1995, abandoned, which is a division of Ser. No. 352,248, Dec. 8, 1994, Pat. No. 5,484,739.

[30] Foreign Application Priority Data

Dec. 17, 1994 [KR] Rep. of Korea .................. 1993-28221

[51] Int. Cl.$^6$ .......................... H01L 29/76; H01L 29/94; H01L 31/06; H01L 23/48
[52] U.S. Cl. .......................... 257/382; 257/383; 257/758; 438/199
[58] Field of Search ...................... 257/382, 750, 257/751, 758, 381, 383, 296; 438/199

[56] References Cited

U.S. PATENT DOCUMENTS 5,237,187  8/1993  Suwanai et al. .................. 257/296

FOREIGN PATENT DOCUMENTS

| 60-180169 | 9/1985 | Japan | 257/383 |
| 2-246369 | 10/1990 | Japan | 257/383 |
| 5-347411 | 12/1993 | Japan | 257/383 |

*Primary Examiner*—Mahshid D. Saadat
*Assistant Examiner*—Jhihan B. Clark
*Attorney, Agent, or Firm*—Cushman Darby & Cushman IP Group of Pillsbury Madison & Sutro LLP

[57] ABSTRACT

A semiconductor device includes a connection pad layer for securing a contact margin which is formed on a first conductivity-type area whereas electrodes are connected directly through openings on a second conductivity-type area without the connection pad layer. A device fabricated according to this structure yields improved punch-through and junction depth characteristics.

17 Claims, 15 Drawing Sheets

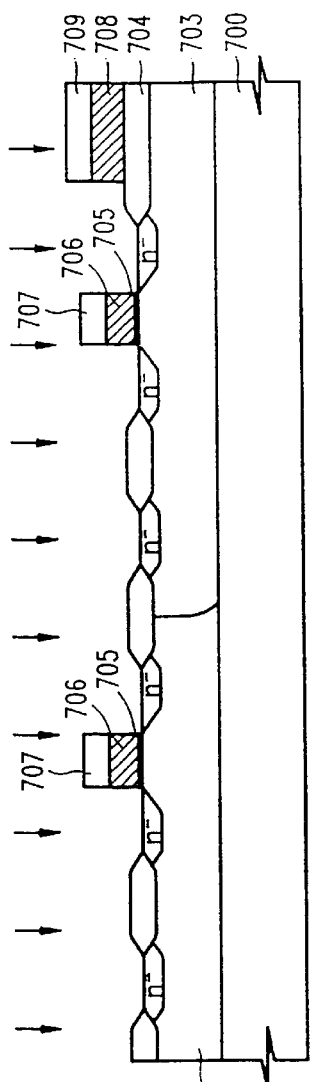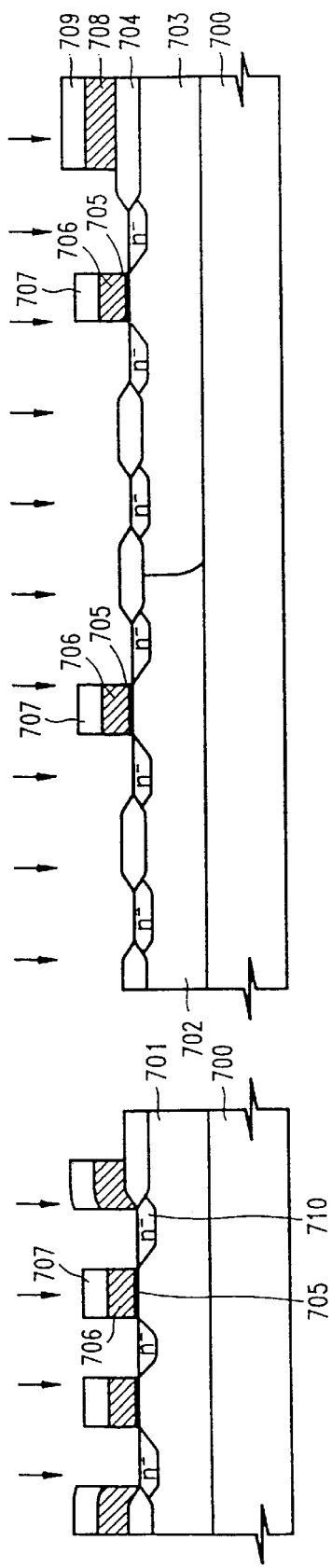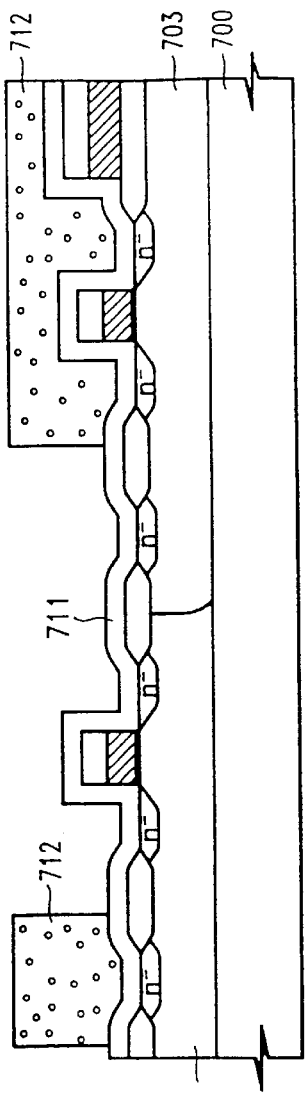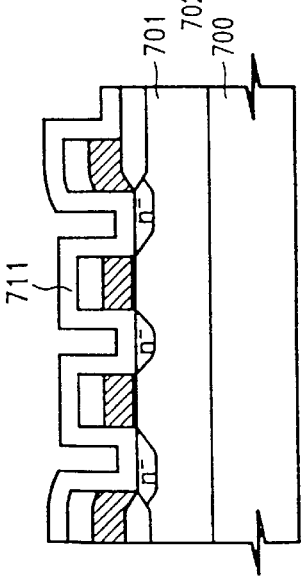

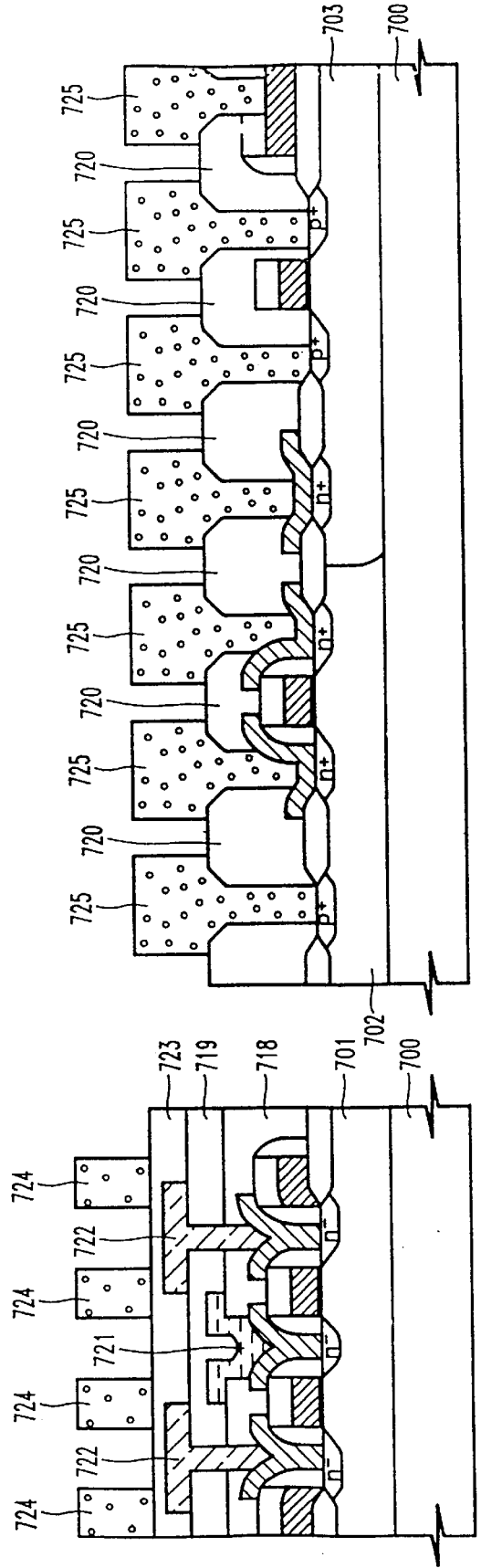

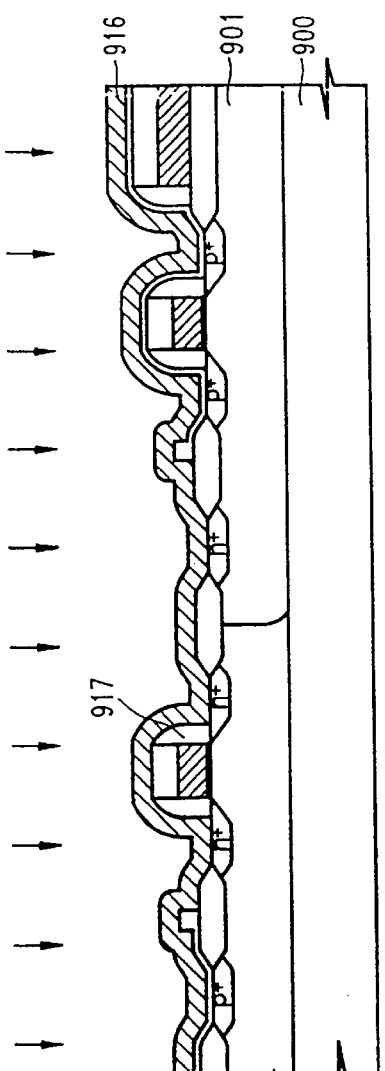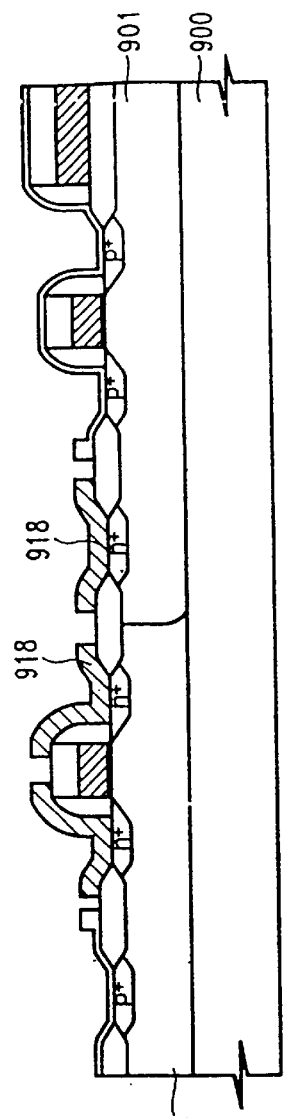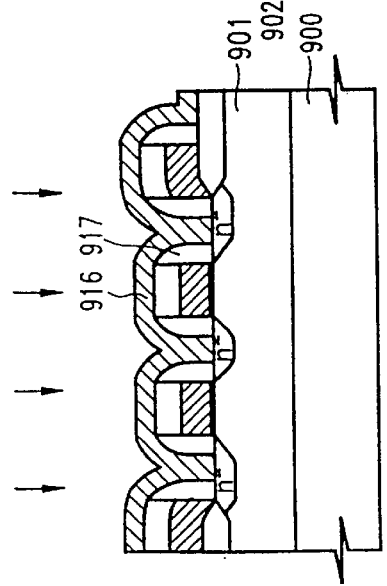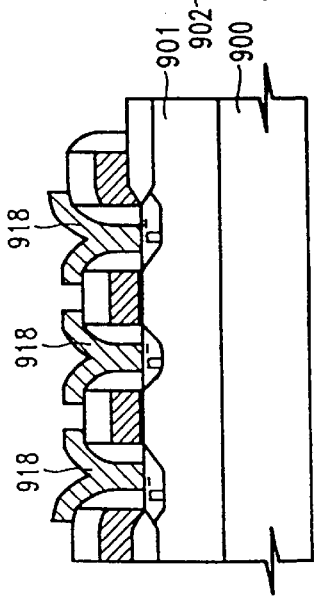

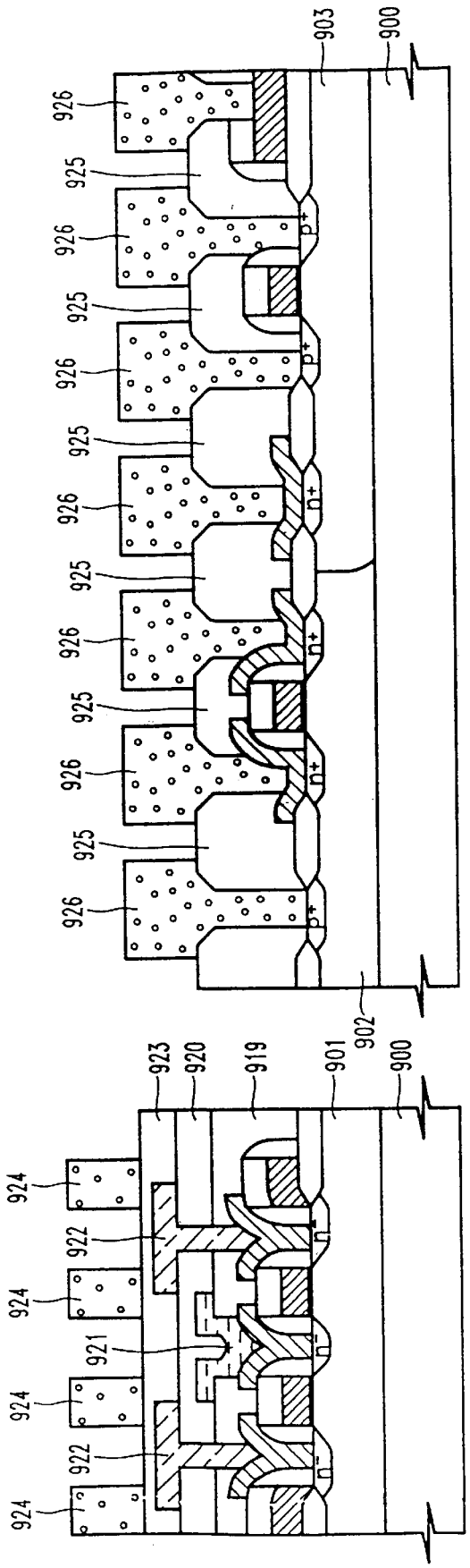

5,818,091

SEMICONDUCTOR DEVICE WITH SELECTIVELY PATTERNED CONNECTION PAD LAYER FOR INCREASING A CONTACT MARGIN

This is a continuation of U.S. application Ser. No. 08/440,397, filed on May 15, 1995, which was abandoned upon the filing hereof, and which was a divisional of U.S. application Ser. No. 08/352,248, filed Dec. 8, 1994, U.S. Pat. No. 5,484,739.

BACKGROUND OF THE INVENTION

The present invention relates to a semiconductor device and manufacturing method thereof, and more particularly, to a a semiconductor device structure for more simply manufacturing a dynamic random access memory (DRAM) including both a PMOS transistor and NMOS transistor.

A DRAM is generally composed of a cell array portion having a plurality of NMOS transistors and capacitors corresponding thereto, and a peripheral circuit portion for driving the cell array portion. The peripheral circuit portion generally is made up of a plurality of CMOS transistors. However, as a device is further integrated, the distance between memory cells is narrowed and therefore a contact hole for exposing the source/drain area is decreased in size, thereby reducing the contact margin.

In order to improve such a problem, there was proposed a technique of forming a connection pad layer on the source/drain area of the plurality of NMOS transistors included in the cell array portion. In the case when the connection pad layer is formed only on the NMOS transistors included in the cell array portion, a step of forming the cell array portion and a step of forming the peripheral circuit portion must be divided, thus requiring many mask patterns. In addition, in the peripheral circuit portion as well as in the cell array portion, as the packing density of device is increased, a unit area where the device is formed is decreased. This demands more efficient utilization of the unit area.

For this reason, there was suggested a technique of forming the connection pad layer for increasing contact margin even on the source/drain area of the transistors included in the peripheral circuit portion. Here, a conventional semiconductor device which has both an NMOS transistor and PMOS transistor and in which the connection pad layer for securing the contact margin is formed on the entire source/drain area, will be discussed with reference to FIG. 1.

Referring to FIG. 1, a P-well 101 and an N-well 102 are selectively formed on a semiconductor substrate 100. In order to define a device isolation area and active area, a device isolating layer 103 such as a field oxide layer is selectively formed on P-well 101. In order to form a channel, n+ source/drain areas 105 and 106 are formed in the active area of P-well 101 at a predetermined interval. A gate insulating layer 115 is formed on the channel. A gate electrode 110 is formed on gate insulating layer 115. A cap insulating layer 112 is formed on gate electrode 110. A spacer insulating layer (spacer) 109a is formed on the sidewalls of the gate electrode 110. A connection pad layer (pad) 111a is formed respectively on n+ source/drain areas 105 and 106. As mentioned earlier, connection pad layer 111a is designed to increase contact margin so that one end is extended onto the top of cap insulating layer 112 and the other end onto the top of device isolating layer 103. Respective connection pad layers 111a are separately formed for electrical insulation, and are electrically insulated from gate electrode 110 by cap insulating layer 112 and spacer insulating layer 109a.

Similar to that of P-well 101, on N-well 102, the device isolating layer 103 is formed to define the active area of the device. In the active area, in order to form a channel, p+ source/drain areas 107 and 108 are formed at a predetermined interval. Gate insulating layer 115, gate electrode 110 and cap insulating layer 112 are sequentially formed on the channel. Spacer insulating layer 109b is formed on the sidewalls of gate electrode 110. Connection pad layer 111b is formed respectively on p+ source/drain areas 107 and 108.

On the PMOS transistor and NMOS transistor, there are formed an interlevel dielectric layer 113 having a plurality of openings for exposing connection pad layers 111a and 111b, and a plurality of electrodes 114 connected respectively to connection pad layers 111a and 111b. For instance, in a DRAM having a cell array portion composed of a plurality of NMOS transistors, the electrodes can correspond to bit lines or word lines.

Advantages of the conventional semiconductor device are as follows.

(1) The connection pad layer is formed on the entire active area including the source/drain area of the PMOS transistor and NMOS transistor, to thereby relax the design rule for contact to be formed.

(2) For a DRAM, the connection pad layer is formed on the peripheral circuit portion including the NMOS transistor and PMOS transistor as well as on the cell array portion including only the NMOS transistors, to thereby reduce step size.

(3) As the connection pad layer is introduced, the active area is reduced whereas the operation speed of device is increased.

Despite such advantages, in order to manufacture such a structure, there should be formed the connection pad layers to both the PMOS transistor and NMOS transistor. This inevitably increases the number of mask patterns.

For further discussion of the problem, a manufacturing process of the semiconductor device will be described below.

(1) First, a substrate 100 is provided and P-well 101 and N-well 102 are selectively formed thereon to selectively form device isolating layer 103 such as a field oxide layer.

(2) A thermal oxide layer is formed as a gate insulating layer on the overall surface of the resultant structure. Then, a first polysilicon layer for forming a gate electrode is formed thereon and an impurity is implanted. Thereafter, a first CVD insulating layer for forming a cap insulating layer is formed and a gate-mask pattern for defining the gate electrode is formed thereon. Using the gate-mask pattern, the first CVD insulating layer, polysilicon layer and thermal oxide layer are sequentially and selectively etched to thereby form cap insulating layer 112, gate electrode 110 and gate insulating layer 115 as shown in FIG. 1.

(3) An n− impurity is implanted on the resultant structure.

(4) A second CVD insulating layer is formed on the overall surface of the resultant structure. An NMOS-mask pattern for exposing an area where the NMOS transistor is to be formed is formed. The second CVD insulating layer formed on an area where the exposed NMOS transistor is to be formed is anisotropically etched to form spacer 109a on the sidewalls of gate electrode 110.

(5) A second polysilicon layer for forming the connection pad layer of NMOS transistor is formed.

(6) An n+ impurity is implanted to form n+ source/drain areas 105 and 106 of the NMOS transistor and simultaneously to dope the second polysilicon layer.

(7) An NMOS pad-mask pattern for defining the connection pad layer of NMOS transistor is formed. The second polysilicon layer is selectively etched by using the pattern to form connection pad layer 111*a*.

(8) The NMOS-mask pattern is removed to form a PMOS-mask pattern for exposing an area where the PMOS transistor is formed.

(9) The second CVD oxide layer left on the area where the PMOS transistor is to be formed is anisotropically etched to form spacer 109*b* on the sidewalls of gate electrode 110.

(10) A third polysilicon layer for forming the connection pad layer of PMOS transistor is formed and a p+ impurity is then implanted to form p+ source/drain areas 107 and 108 of NMOS transistor and simultaneously to dope the third polysilicon layer.

(11) A PMOS pad-mask pattern for defining the connection pad layer of PMOS transistor is formed. By using the pattern, the third polysilicon layer is selectively etched to form connection pad layer 111*b*.

(12) An interlevel dielectric layer 113 is formed on the overall surface of the resultant structure. In order to form a plurality of openings for exposing connection pad layers 111*a* and 111*b*, the interlevel dielectric layer is selectively etched by using a contact-mask pattern.

(13) A plurality of electrodes 114 respectively connected to connection pad layers 111*a* and 111*b* through the openings are formed.

In the above manufacturing method, if an n– impurity is implanted into the entire source/drain area of the NMOS transistor and PMOS transistor in step (3), the NMOS transistor has an LDD structure and thus has an improved characteristics. However, in this case, since a p-type conductive area is formed on the source/drain area of the PMOS transistor, although a p+ impurity is implanted later, a threshold voltage becomes extremely high to produce difficulty in driving.

Generally, in the case where there is no connection pad layer, an n– impurity is doped on the source/drain area of the PMOS transistor and a p+ impurity is doped later. By doing so, the n– doped area acts to preclude the diffusion of the p-type impurity, which exhibits a preferable effect.

However, as shown in FIG. 1, when the connection pad layer is formed on the source/drain area of PMOS transistor and then p+ impurity is implanted, the impurity cannot be implanted efficiently and the threshold voltage becomes extremely high as mentioned above. Meanwhile, when the p+ impurity is implanted heavily in order to reduce the threshold voltage of PMOS transistor, the depth of junction becomes severely deep. Moreover, since the diffusivity of boron (generally used as the p-type impurity) is very high, the punch-through of PMOS transistor is deteriorated.

In order to overcome these problems, there was proposed a method of forming an n– impurity-doped mask pattern to thereby dope the n– impurity only into the source/drain area of NMOS transistor in step (3). In this case, however, the number of mask patterns used during the manufacturing process is increased. A mask pattern generally is formed by photolithography and requires a great deal of cost and time, increasing the overall production cost of a semiconductor device, such that any increase in the number of mask patterns is very unfavorable.

SUMMARY OF THE INVENTION

Therefore, it is an object of the present invention to provide a semiconductor device which can be manufactured more easily and has an improved reliability.

To accomplish this and other objects of the present invention, there is provided a semiconductor device comprising:

a semiconductor substrate;

at least one first conductivity-type area and at least one second conductivity-type selectively formed on the semiconductor substrate;

a connection pad layer formed on the first conductivity-type area and extended by interposing an insulating layer on a portion adjacent the first conductivity-type area and for increasing a contact margin; and an interlevel dielectric layer having a plurality of openings for exposing the second conductivity-type area and connection pad layer.

The semiconductor device further comprises:

a plurality of first electrodes formed by interposing an insulating layer on the semiconductor substrate; and a cover insulating layer for exposing the first conductivity-type area and covering the first electrodes formed adjacent to the first conductivity-type area, wherein the connection pad layer is extended to the top of the first electrode electrically insulated by the cover insulating layer.

The first electrode is a gate electrode, and the cover insulating layer comprises a cap insulating layer formed on the gate electrode and a spacer insulating layer formed on the sidewalls of the gate electrode. The connection pad layer is made of polysilicon into which a first conductivity-type impurity is doped.

According to another aspect of the present invention, semiconductor device comprises:

a semiconductor substrate;

at least one first conductivity-type MOS transistor having first conductivity-type source/drain areas formed on the semiconductor substrate while being spaced apart, and a gate electrode formed on the semiconductor substrate and interposing a gate insulating layer;

a gate cover insulating layer formed to cover the gate electrode of the first conductivity-type MOS transistor;

a first connection pad layer formed on the surface made up of the source area and gate cover insulating layer of the first conductivity-type MOS transistor;

a second connection pad layer formed on the surface made up of the drain area and gate cover insulating layer of the first conductivity-type MOS transistor and electrically insulated from the first connection pad layer;

at least one second conductivity-type MOS transistor having second conductivity-type source/drain areas formed on the semiconductor substrate while being spaced apart, and a gate electrode formed on the semiconductor substrate and interposing a gate insulating layer;

an interlevel dielectric layer having a plurality of openings for exposing the first and second connection pad layers and the source/drain area of the second conductivity-type MOS transistor; and a plurality of electrodes tied respectively to the first and second connection pad layers and the source/drain area of the second conductivity-type MOS transistor through the openings.

According to still another aspect of the present invention, a semiconductor device comprises:

a semiconductor substrate;

a cell array portion including a plurality of first conductivity-type transistors each having a source, drain and gate, and a plurality of first conductivity-type connection pad layers formed on the source/drain area of the first conductivity-type transistor and for increasing a contact margin; and a peripheral circuit portion including a plurality of first and second conductivity-type transistors each having a source, drain and gate, and a plurality of first conductivity-type connection pad layers formed on the source/drain areas of the first conductivity-type transistor and for increasing contact margin.

In the semiconductor device, the first conductivity-type MOS transistor included in both the cell array portion and peripheral circuit portion is an NMOS transistor having a source/drain area having a lightly-doped-drain structure. The second conductivity-type MOS transistor included in the peripheral circuit portion is a PMOS transistor having a single-drain structure.

BRIEF DESCRIPTION OF THE DRAWINGS

The above objects and advantages of the present invention will become more apparent by describing in detail preferred embodiments thereof with reference to the attached drawings in which:

FIGS. 7A–7G and 8A–8G are cross-sectional views of intermediate structures of a semiconductor device to thereby sequentially illustrate the manufacturing process of one embodiment of a manufacturing method of semiconductor device of the present invention; and FIGS. 9A–9G and 10A–10G are cross-sectional views of intermediate structures of a semiconductor device to thereby sequentially illustrate the manufacturing process of another embodiment of a manufacturing method of semiconductor device of the present invention

DETAILED DESCRIPTION OF THE INVENTION

Figure 1:
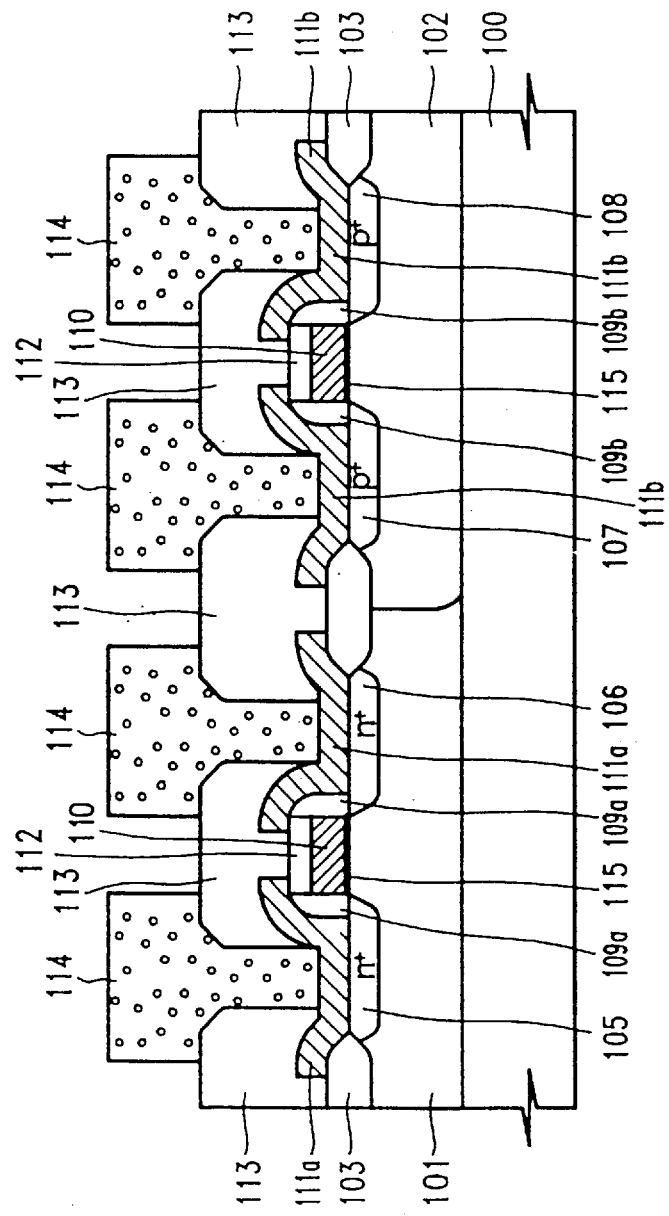
FIG. 1 is a cross-sectional view of a conventional semiconductor device.
Figure 2:
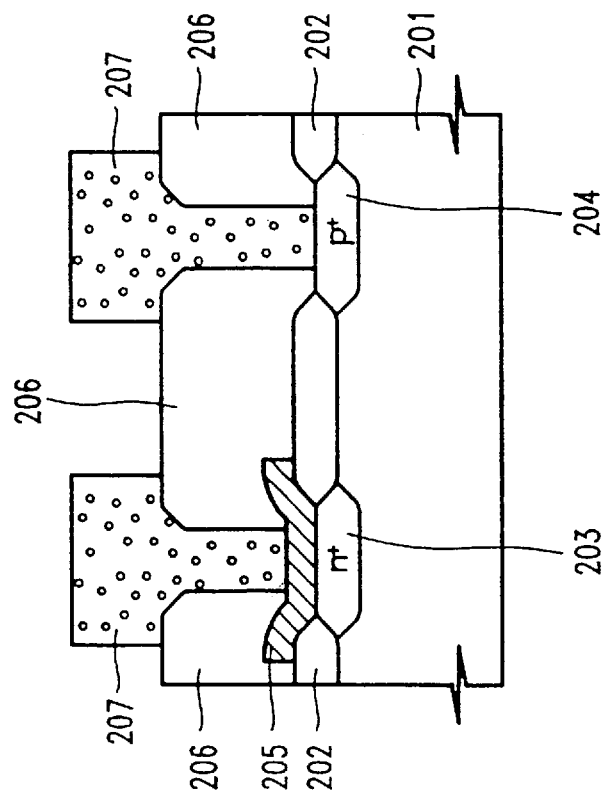
FIG. 2 is a cross-sectional view of one embodiment of a semiconductor device of the present invention.

FIG. 2 is a cross-sectional view of one embodiment of a semiconductor device of the present invention.

Referring to FIG. 2, a device isolating layer 202 is selectively formed on semiconductor substrate 201 in order to define a device isolation area and an active area. In the active area, N-type area 203 and P-type area 204 are selectively formed. A connection pad layer 205 for increasing the contact margin is formed on N-type area 203. However, the connection pad layer is not formed on P-type area 204. An interlevel dielectric layer 206 having a plurality of openings for exposing connection pad layer 205 and P-type area 204 is formed on the surfaces of device isolating layer 202, connection pad layer 205 and P-type area 204. A plurality of electrodes 207 respectively connected to connection pad layer 205 and P-type area 204 through the openings are formed on the interlevel dielectric layer 206.

Figure 3:
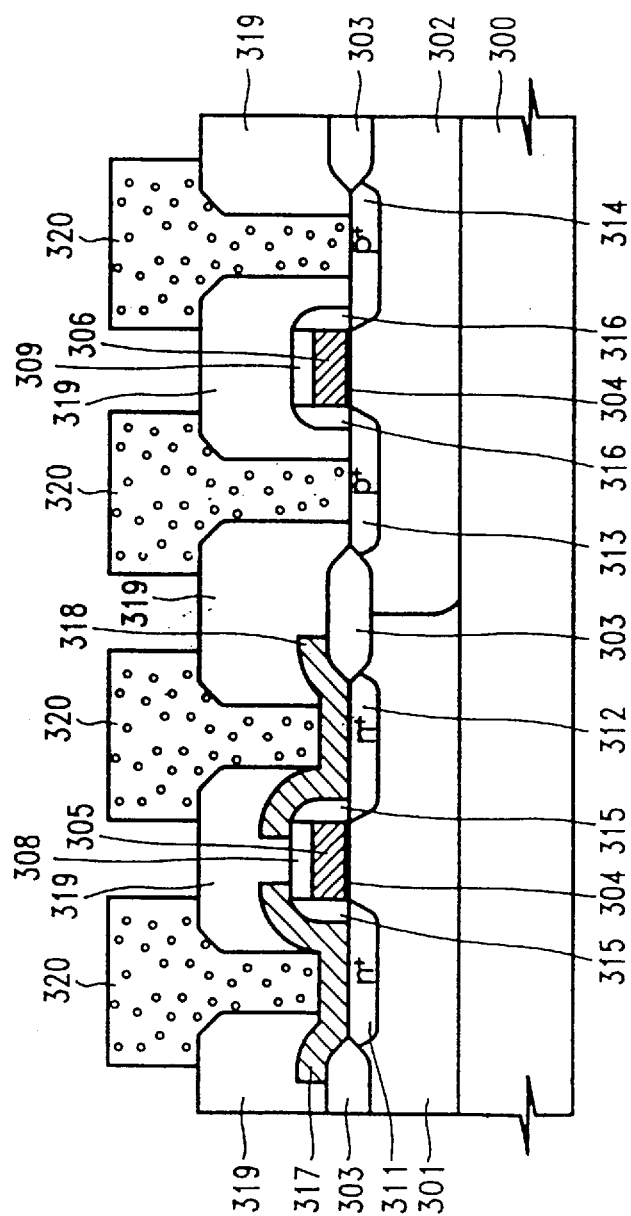
FIG. 3 is a cross-sectional view of another embodiment of semiconductor device of the present invention.

FIG. 3 is a cross-sectional view of another embodiment of semiconductor device of the present invention.

Referring to FIG. 3, a P-well 301 and an N-well 302 are selectively formed on substrate 300. In order to define the device isolation area and active area, a device isolating layer 303 such as field oxide layer is selectively formed on P-well 301 and N-well 302.

For a channel, n+ source/drain areas 311 and 312 are formed, while being spaced apart, in P-well 301. A gate insulating layer 304 is interposed on the channel, to form a gate electrode 305. A cap insulating layer 308 is formed on gate electrode 305, and spacer insulating layer 315 is formed on the sidewalls of gate electrode 305. In order to increase the size of the contact margin, connection pad layers 317 and 318 are formed on n+ source/drain areas 311 and 312.

In order to form a channel, p+ source/drain areas 313 and 314 are formed while being spaced apart. Gate insulating layer 304 is interposed on the channel, to form gate electrode 306. Cap insulating layer 309 is formed on gate electrode 306. Spacer insulating layer 316 is formed on the sidewalls of gate electrode 306. As shown in FIG. 3, the connection pad layer is not formed on the source/drain area of the PMOS transistor but only on the source/drain of the NMOS transistor.

Here, contrary to FIG. 3, the spacer may not be formed on the sidewalls of gate electrode 306 of the PMOS transistor. In this case, the source/drain of NMOS transistor has an LDD (lightly doped drain) structure, with the source/drain of PMOS transistor having an SD (single drain) structure.

Even in the case when the spacer is formed on the sidewalls of PMOS transistor, the source/drain area of PMOS transistor can have the SD structure.

Returning to FIG. 3, an interlevel dielectric layer 319 having a plurality of openings for exposing the connection pad layers 317 and 318 and p+ source/drain areas 313 and 314 is formed on the NMOS transistor and PMOS transistor. A plurality of electrodes 320 connected to connection pad layers 317 and 318 and p+ source/drain areas 313 and 314 are formed on interlevel dielectric layer 319.

Preferred embodiments of a manufacturing method of a semiconductor device having the above-described structure will be described below.

First Embodiment (1) N-well and P-well formation

A semiconductor substrate 300 is provided and N-well 302 and P-well 301 are selectively formed on semiconductor substrate 300.

(2) device isolation

In order to define an active area and device isolation area, device isolating layer 303 such as field oxide layer is formed using a conventional method such as LOCOS (Local oxidation of silicon).

(3) gate electrode formation

For an insulating layer, gate oxide layer is formed on the active area to a thickness of 70–200Å. In order to form a gate electrode, polysilicon is deposited on the gate oxide layer to a thickness of 1,000–2,000Å, and an N-type impurity such as phosphorus is implanted. In order to form a cap insulating layer, an oxide layer is deposited to a thickness of 1,000–2,500Å by using a CVD process, and a gate-mask pattern for defining the respective gate electrodes is formed thereon by photolithography. Then, the CVD oxide layer, polysilicon layer and gate oxide layer are selectively etched by using the gate-mask pattern, to thereby form gate electrode 305 having cap insulating layer 308 and simultaneously to expose portions where the source/drain areas of the PMOS transistor and NMOS transistor are formed.

(4) n– impurity implantation

When the formation of gate electrode is finished, if necessary, a thermal oxidation is used to form an oxide layer to a thickness of 50–100Å. This oxide layer serves to alleviate damage due to a succeeding etching step and impurity implantation step. An n– impurity is implanted into the overall surface of the resultant structure by the dose of $1 \times 10^{13}$–$5 \times 10^{13}$ ions/cm$^2$. The area where n– impurity is doped forms an LDD-structured source/drain area in the NMOS transistor, and, in the PMOS transistor, serves to prevent the threshold voltage from being significantly lowered because the p-type impurity is excessively diffused.

(5) first insulating layer formation

In order to form a spacer on the resultant structure, a first insulating layer such as an oxide layer is formed to a thickness of about 2,000Å by a CVD process.

(6) NMOS-mask pattern formation

A photoresist is coated on the overall surface of the resultant structure and selectively etched to expose portions where the NMOS transistors are to be formed.

(7) spacer formation on the gate sidewalls of an NMOS transistor

The first insulating layer exposed by the NMOS-mask pattern is anisotropically etched according to the geometric characteristic of the lower structure, to thereby form spacer insulating layer 315 on the gate sidewalls of the NMOS transistor and simultaneously to expose an active area for forming n+ source/drain areas 311 and 312. Subsequently, the NMOS-mask pattern is removed.

(8) polysilicon layer formation for forming the connection pad layer

For the connection pad layer, a polysilicon layer is deposited to a thickness of 1,000Å or deposited to 2000–4,000Å and etched by a thickness of 1,000–3,000 Å. As a result, the thickness of polysilicon layer is 1,000Å on the active area.

Here, in the case when the semiconductor device is a DRAM, the diameter of the opening to the thickness of the polysilicon formed in the cell array portion is set to be below 2:1 to thereby bury the connection pad layer. If the connection pad layer is not designed to be buried at least the pad layer is sufficiently thick with respect to the peripheral circuit. This purpose is done to differentiate the doping concentrations at the top of the pad and at the junction of the pad and the source/drain doping area, in other words, to minimize the effect of a succeeding n+ impurity implantation to the source/drain area and to dope the source/drain area of the transistor formed in the peripheral circuit portion with the n+ impurity implantation, simultaneously with the doping of the pad.

(9) n+ impurity implantation

The n+ impurity required in forming n+ source/drain areas 311 and 312 of the NMOS transistor is implanted at the dose of $10^{15}$–$2 \times 10^{16}$ ions/cm$^2$. Here, for performance enhancement, the n+ impurity can be implanted twice by differentiating the implantation energy and dose. For instance, arsenic, an N-type impurity, is firstly implanted at the implantation energy of 80–100 KeV and at the dose of $5$–$9 \times 10^{15}$ ions/cm$^2$ and secondly implanted at the implantation energy of 40 KeV and at the dose of $5 \times 10^{15}$ ions/cm$^2$.

(10) connection pad layer patterning

After the n+ impurity is implanted under optimal conditions, a photoresist is coated to define a portion where the pad is formed. In order to secure a sufficient overlap area of the device isolation area and spacer, the polysilicon layer is selectively etched to form a connection pad layer.

(11) PMOS-mask pattern formation

When the formation of connection pad layers 317 and 318 on n+ source/drain areas 311 and 312 of the NMOS transistor is completed, a photoresist is coated on the overall surface of the resultant structure and patterned so that a PMOS-mask pattern is formed to block the portion where the NMOS transistor is to be formed and to expose the portion where the PMOS transistor is to be formed.

(12) spacer formation on the sidewalls of the gate of PMOS transistor

The first insulating layer left on the portion exposed by the PMOS-mask pattern is anisotropically etched to expose portions where p+ source/drain areas 313 and 314 are to be formed and simultaneously to form spacer insulating layer 316 on the sidewalls of gate electrode 306 of the PMOS transistor.

(13) p+ impurity implantation

Using the PMOS-mask pattern, cap insulating layer 309 and spacer insulating layer 316 as impurity-implantation preventing masks, a p+ impurity is implanted into p+ source/drain areas 313 and 314 of the PMOS transistor.

(14) interlevel dielectric layer formation

After the interlevel dielectric layer is formed on the overall surface of the resultant structure through a CVD process and patterned to form a plurality of openings for exposing connection pad layers 317 and 318 and p+ source/drain areas 313 and 314.

(15) electrode formation

A plurality of electrodes 320 connected respectively to connection pad layers 317 and 318 and p+ source/drain areas 313 and 314 through the openings are formed. Here, the electrodes may be formed through metalization.

Another method of manufacturing the semiconductor device shown in FIG. 3 will be described below.

Second Embodiment

In this embodiment, the first five steps, i.e., N-well/P-well forming step (1), device isolation step (2), gate electrode formation step (3), n– impurity implantation step (4) and first insulating layer formation step (5), are the same as those in the first embodiment.

(6) PMOS-mask pattern formation

A photoresist is coated on the overall surface of the resultant structure and patterned to expose a portion where the PMOS transistor is to be formed and to form a PMOS-mask pattern for block a portion where the NMOS transistor is to be formed.

(7) spacer formation on the gate sidewalls of a PMOS transistor

The first insulating layer formed on the exposed portion is anisotropically etched to expose p+ source/drain areas 313 and 314 of the PMOS transistor and simultaneously to form a spacer insulating layer 316 on the gate sidewalls of the PMOS transistor.

When the spacer insulating layer is formed, the PMOS-mask pattern is removed. Here, although the PMOS-mask pattern is removed, the first insulating layer is left on the portion where the NMOS transistor is formed. The left first insulating layer is used as a mask in a succeeding step.

(8) p+ impurity implantation

If necessary, in order to alleviate damage due to a succeeding etching step, a thermal oxide layer of 50–100Å is formed on the resultant structure.

Using the cap insulating layer 309 and spacer insulating layer 316 as impurity-implantation preventing masks, p+ impurity is implanted to form p+ source/drain areas 313 and 314 of the PMOS transistor.

(9) forming of second insulating layer

A second insulating layer of about 500Å is formed by CVD.

(10) forming of NMOS-mask pattern

A photoresist is coated on the overall surface of the resultant structure and selectively etched to expose portions where the NMOS transistor is to be formed.

(11) forming of spacer on the gate sidewalls of NMOS transistor

The first insulating layer formed on the portions exposed by the NMOS-mask pattern is anisotropically etched according to geometric characteristic of the lower structure so that the spacer insulating layer 315 is formed on the gate sidewalls of the NMOS transistor and simultaneously the active area for forming n+ source/drain areas 311 and 312 is exposed. Then, the NMOS pattern is removed.

(12) forming of polysilicon for connection pad layer

After the NMOS-mask pattern is removed, a polysilicon layer of about 1,000Å is formed for the connection pad layer on the overall surface of the resultant structure.

(13) n+ impurity implantation n+ impurity is implanted to form n+ source/drain areas 311 and 312 of the NMOS transistor.

(14) patterning of connection pad layer

After the n+ impurity is implanted in optimal conditions, a photoresist is coated to define a portion of the pad. Thereafter, the polysilicon layer is selectively etched to form the connection pad layer so that the overlap portion of the device isolation area and spacer is sufficiently secured.

(15) forming of interlevel dielectric layer

An interlevel dielectric layer is formed on the overall surface of the resultant structure by CVD and patterned to thereby form a plurality of openings for exposing connection pad layers 317 and 318 and p+ source/drain areas 313 and 314.

(16) forming of electrode

A plurality of electrodes 320 coupled to connection pad layers 317 and 318 and to p+ source/drain areas 313 and 314 through the openings are formed. Here, the electrodes can be formed through metalization.

Third Embodiment

The third embodiment is almost the same as the second embodiment. The difference is that the second insulating layer is not formed as in step (9) of the second embodiment and the NMOS-mask pattern is removed after the finish of n+ impurity implantation in step (13) not in step (11). This means that the second insulating layer acting as a mask for blocking the source/drain area of the PMOS transistor in the n+ impurity implantation is replaced with the NMOS-mask pattern acting as the impurity implantation blocking mask.

Figure 4:
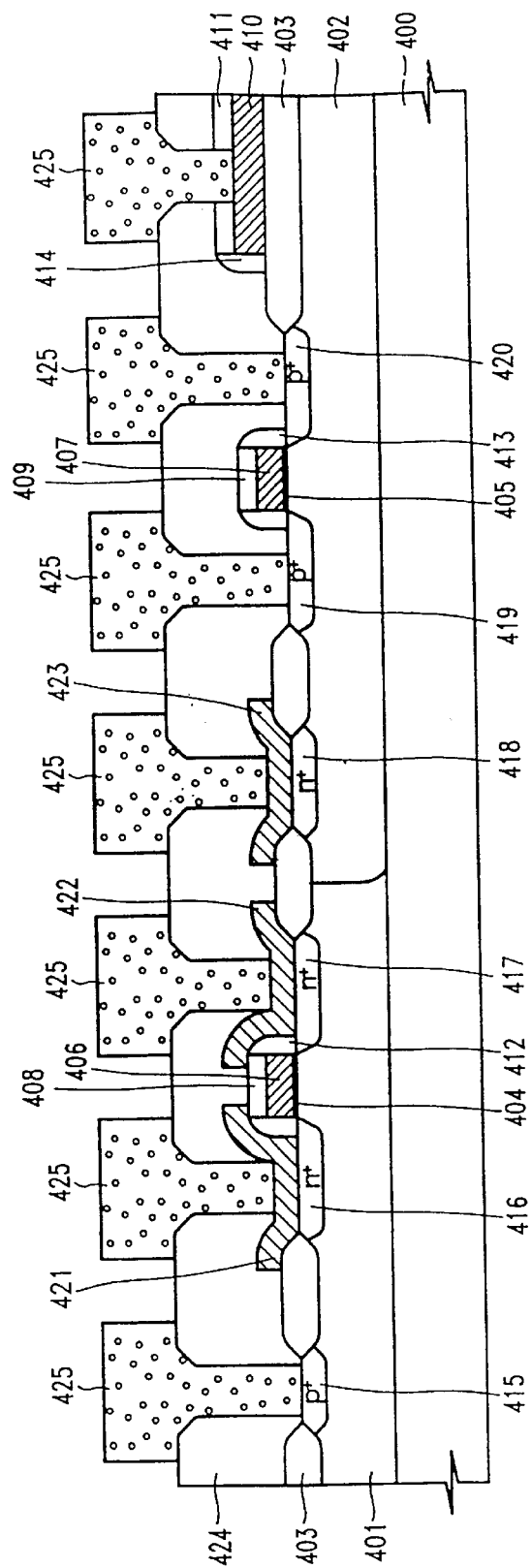
FIG. 4 is a cross-sectional view of still another embodiment of semiconductor device of the present invention.

FIG. 4 is a partial cross-sectional view of still another embodiment of the semiconductor device of the present invention which can be included in the peripheral circuit portion of DRAM.

In FIG. 4, a PMOS transistor, NMOS transistor, N-type area 418 and P-type area 415 are formed. Besides the gate electrodes of respective transistors, an electrode 410 used for wire is formed. An interlevel dielectric layer 424 having a plurality of openings is formed on the PMOS transistor, NMOS transistor and wire electrode 410. A plurality of electrodes 425 coupled to respective exposure portions through the openings are formed on the interlevel dielectric layer.

More specifically, n+ source/drain areas 416 and 417, gate insulating layer 404 and gate electrode 406 form the NMOS transistor. p+ source/drain areas 419 and 420, gate insulating layer 405 and gate electrode 407 form the PMOS transistor. Cap insulating layers 408, 409 and 411 are formed on gate electrodes 406 and 407 and wire electrode 410 of the respective transistors. Connection pad layers 421, 422 and 423 for increasing contact margin are formed on n+ source/drain areas 416 and 417 and N-type area 418 of the NMOS transistor. However, the connection pad layer is not formed on p+ source/drain areas 419 and 420 and P-type area 415 of the PMOS transistor. Wire electrode 410 can be formed together with the gate electrode and is located on device isolating layer 403.

In the method of manufacturing the semiconductor device shown in FIG. 4, the embodiments of the manufacturing method related to FIG. 3 can be employed. The PMOS-mask pattern serves to expose a portion where the PMOS transistor is formed and a portion where P-type area 415 is formed. The NMOS-mask pattern acts to expose a portion where the NMOS transistor is to be formed and a portion where N-type area 418 is formed. A portion for forming the wire layer is designed to be exposed by one of the PMOS-mask pattern and NMOS-mask pattern.

Figure 5:
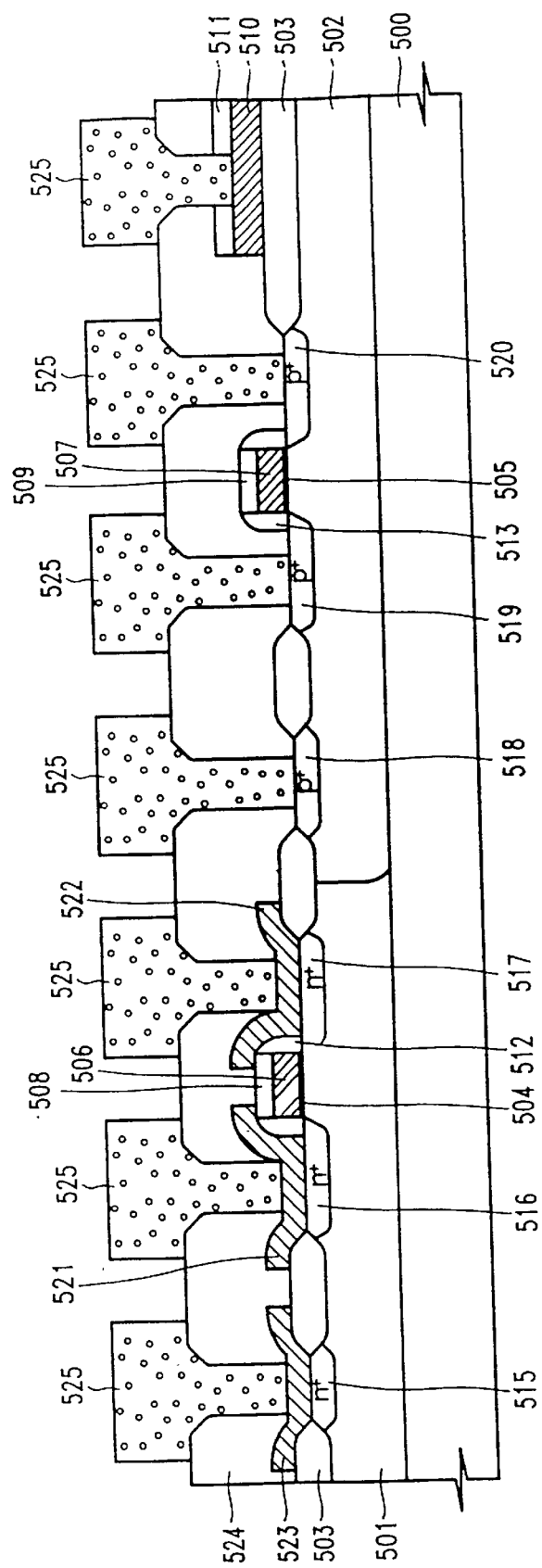
FIG. 5 is a partial cross-sectional view of yet another embodiment of semiconductor device of the present invention.

FIG. 5 is a partial cross-sectional view of yet another embodiment of the semiconductor device of the present invention and has almost the same configuration as that of the semiconductor device shown in FIG. 4.

Referring to FIG. 5, the difference is that the n-type area 515 is formed in P-well 501 not in N-well 502 and that the spacer insulating layer is not formed on the sidewalls of wire electrode 510.

In FIG. 5, n+ source/drain areas 516 and 517, gate insulating layer 504 and gate electrode 506 form the NMOS transistor. p+ source/drain areas 519 and 520, gate insulating layer 505 and gate electrode 507 form the PMOS transistor. Spacer insulating layers 512 and 513 are formed on the sidewalls of gate electrodes 506 and 507.

Connection pad layers 521, 522 and 523 for increasing contact margin are formed on n+ source/drain areas 516 and 517 and N-type area 515 of the NMOS transistor. The connection pad layers are not formed on p+ source/drain areas 519 and 520 and P-type area 518 of the PMOS transistor. Here, spacer insulating layer 512 formed on the sidewalls of gate electrode 506 of the NMOS transistor functions to electrically insulate connection pad layers 521 and 522 from gate electrode 506.

Figure 6A:
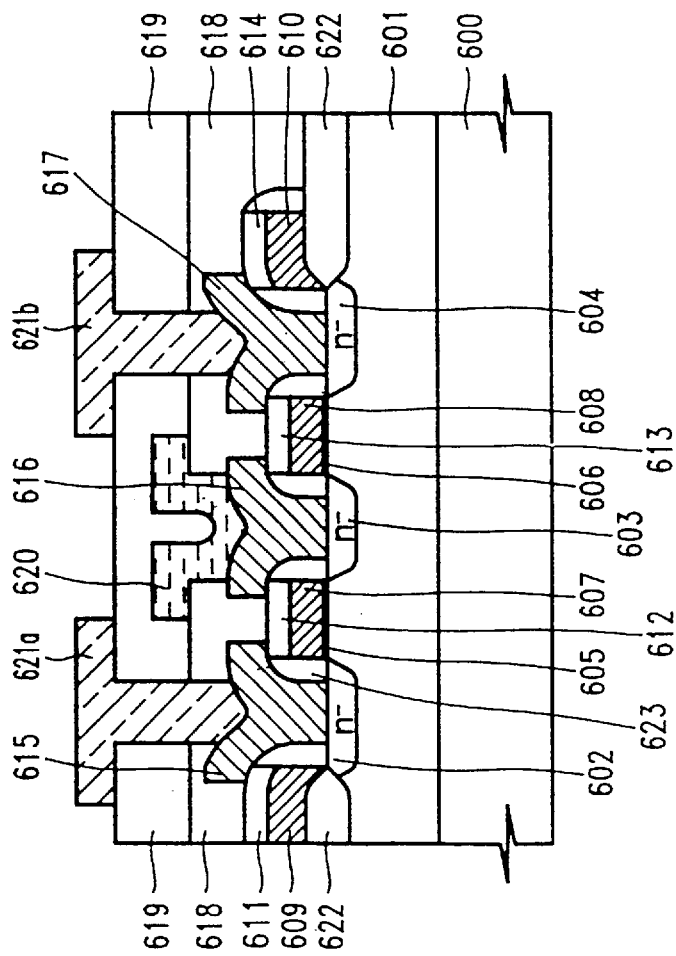
FIG. 6A is a cross-sectional view of a memory cell included in the cell array portion of a DRAM of the present invention.

FIG. 6A is a cross-sectional view of a memory cell included in the cell array portion of the DRAM of the present invention.

Referring to FIG. 6A, P-well 601 is formed on semiconductor substrate 600. A device isolating layer 622 is selectively formed on P-well 601. Source/drain areas 602, 603 and 604 are formed on the active area while being spaced apart. Gate insulating layers 605 and 606 are interposed on the channel formed between the source/drain areas to thereby form gate electrodes 607 and 608. Cap insulating layers 612 and 613 are formed respectively on gate electrodes 607 and 608. Wire electrodes 609 and 610 are formed on device isolating layer 622. The cap insulating layers are also formed on wire electrodes 609 and 610. Connection pad layers 615, 616 and 617 for increasing contact margin are formed on n– source/drain areas 602, 603 and 604. First interlevel dielectric layer 618 and second interlevel dielectric layer 619 are sequentially formed thereon. A bit line 620 tied to connection pad layer 616 through an opening is formed between first interlevel dielectric layer 618 and second interlevel dielectric layer 619. Storage electrodes 621a and 621b are formed on second interlevel dielectric layer 619.

Figure 6B:
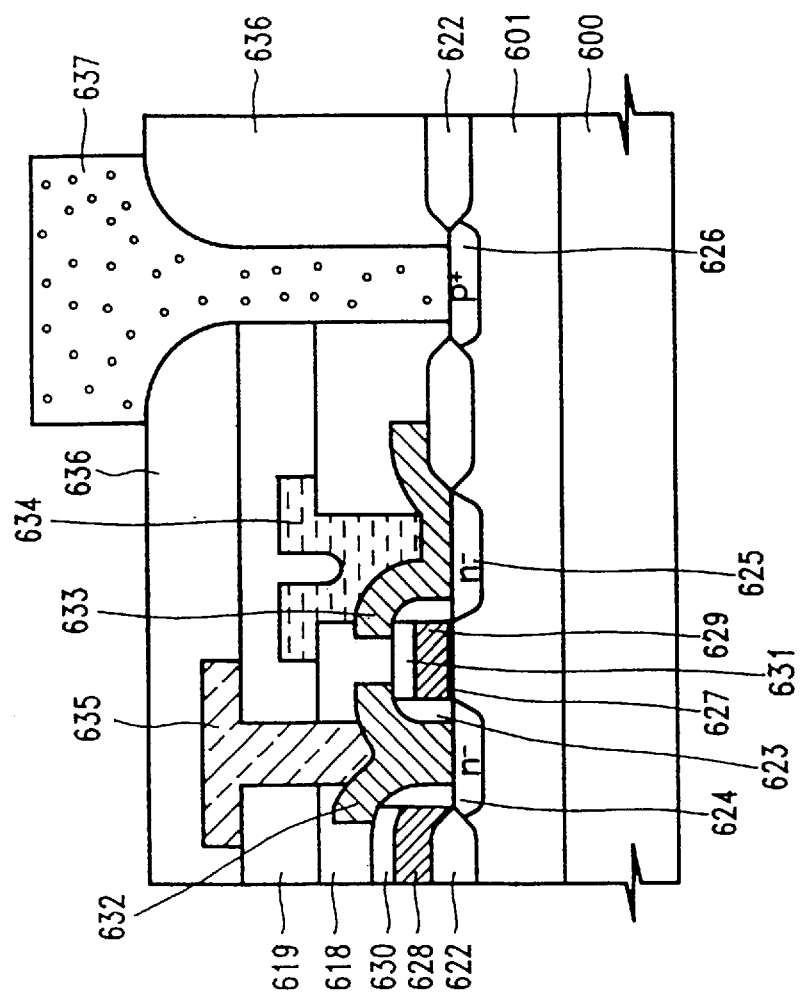
FIG. 6B is a cross-sectional view of a structure appearing at the border of the cell array portion of the DRAM of the present invention.

FIG. 6B is a cross-sectional view of the structure appearing at the border of the cell array portion and the peripheral circuit portion of the DRAM of the present invention.

Referring to FIG. 6B, P-well 601 is formed on semiconductor 600. Device isolating layer 622 is selectively formed on P-well 601 to define an active area. In the active area, n– source/drain areas 624 and 625 and p+ area 626 are formed. Gate insulating layer 627 is interposed on the channel formed between n– source/drain areas 624 and 625 to thereby form gate electrode 629. Cap insulating layer 631 is formed thereon. Wire electrode 628 and cap insulating layer 630 are sequentially formed on device isolating layer 622. Connection pad layers 632 and 633 for increasing contact margin are formed on n– source/drain areas 624 and 625. The connection pad layers are not formed on p+ area 626, with electrode 637 being tied directly thereto.

Connection pad layer 633 is coupled to bit line 634 through the opening formed on interlevel dielectric layer 618. Interlevel dielectric layer 619 is formed on bit line 634. Electrode 635 coupled to connection pad layer 632 through the opening is formed on interlevel dielectric layer 619. Insulating layer 636 is formed on electrode 635.

FIGS. 7A–7G and 8A–8G are sequential cross-sectional views of intermediate structures of a semiconductor device of the present invention, with FIGS. 7A–7G especially showing part of the cell array portion of DRAM and FIGS. 8A–8G showing part of the peripheral circuit portion thereof.

Referring to FIGS. 7A and 8A, a semiconductor substrate 700 is provided, and P-wells 701 and 702 and N-well 703 are selectively formed thereon. Device isolating layer 704 is selectively formed on the respective wells. Subsequently, in order to form gate electrodes and wire electrodes, a first insulating layer of 70–200Å for gate insulating layer 705, and a polysilicon layer of 1,000–2,000Å for gate electrode 706 and wire electrode, are sequentially formed on the overall surface of the resultant structure. An impurity is doped into the polysilicon layer. A second insulating layer of 1,000–2,500Å for forming cap insulating layers 707 and 709 is formed. Then, using gate-mask patterns for defining the respective electrodes, the second insulating layer, the polysilicon layer where the impurity is doped, and the first insulating layer are sequentially and selectively etched. In order to alleviate the device's damage due to succeeding etching and impurity implantation steps, if required, an oxide layer of 50–100Å is formed by thermal oxidation.

Using cap insulating layers 707 and 709 and device isolating layer 704 as impurity-implantation preventing masks, n– impurity of the dose of $1–5\times10^{13}$ ions/cm$^2$ is implanted to form a plurality of n– areas 710.

Referring to FIGS. 7B and 8B, a third insulating layer 711 of 2,000Å is formed on the overall surface of the resultant structure, and a first mask pattern 712 for exposing portions for forming the NMOS transistor and N-type area is formed. By doing so, first mask pattern 712 exposes portions where the NMOS transistors included in the cell array portion and the NMOS transistor and N-type area included in the peripheral circuit portion of DRAM are formed.

Figure 7C:
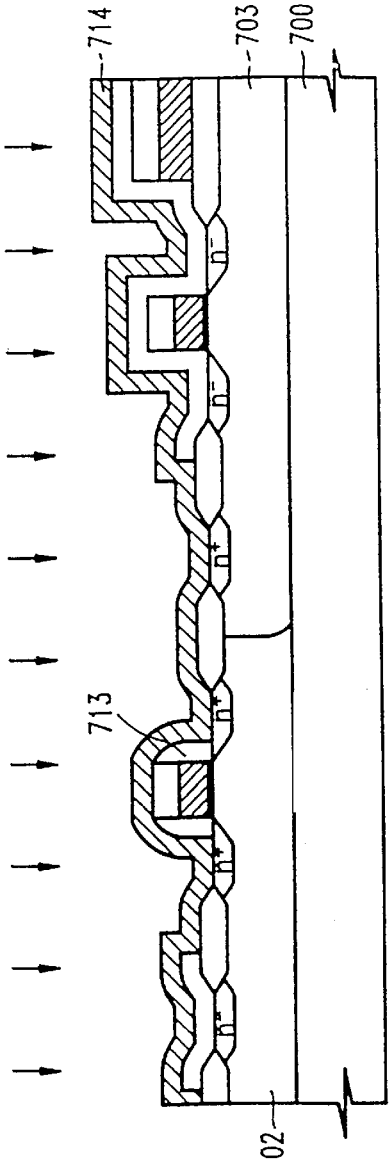
Figure 8C:
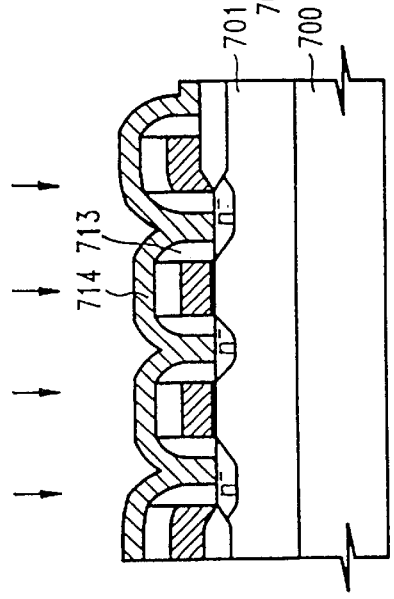

Third insulating layer 711 formed on the portions exposed by first mask pattern 712 is anisotropically etched so that, as shown in FIGS. 7C and 8C, spacer insulating layers 713 are formed on the sidewalls of the respective electrodes formed on the exposed portions and simultaneously active areas are exposed. Then, after removing first mask pattern 712, the polysilicon layer 714 of 1,000Å is formed in order to form the connection pad layer on the overall surface of the resultant structure.

Using third insulating layer 711 and device isolating layer 704 both left under polysilicon layer 714 as impurity-implantation preventing masks, n+ impurity is implanted at the dose of $10^{15}–2\times10^{16}$ ions/cm$^2$ to thereby dope the impurity into polysilicon layer 714 and simultaneously to allow the source/drain areas and N-type area of the NMOS transistor to have an LDD structure.

Figure 7D:
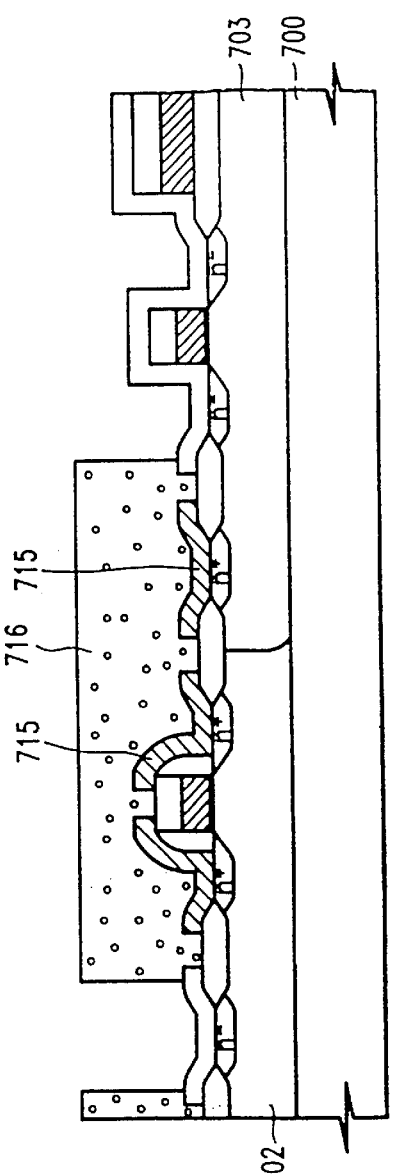
Figure 8D:
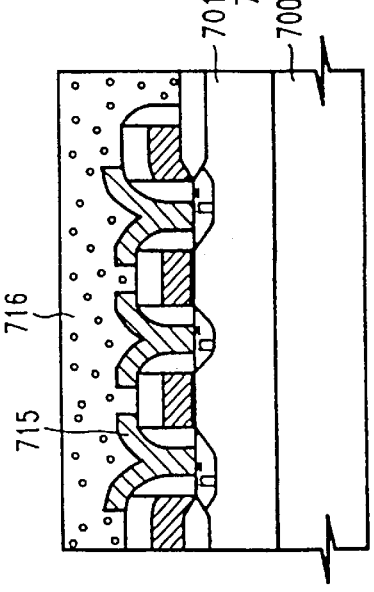

The polysilicon layer 714 is patterned so that, as shown in FIGS. 7D and 8D, the source/drain area and N-type area of the NMOS transistor are covered and a plurality of connection pad layers 715 for increasing contact margin are formed.

A photoresist is coated and selectively patterned to form a second mask pattern 716 for exposing the PMOS transistor and P-type area. Here, in most cases second mask pattern 716 is complementary to first mask pattern 712.

Figure 7E:
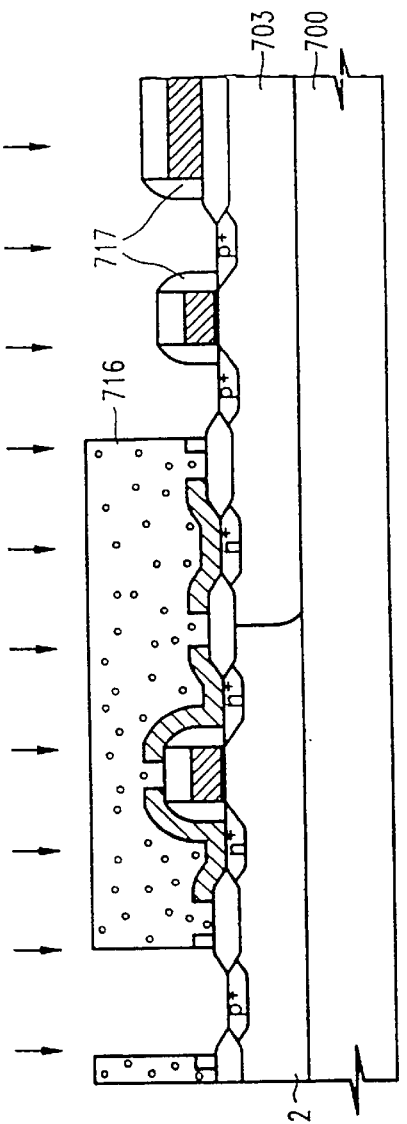
Figure 7F:
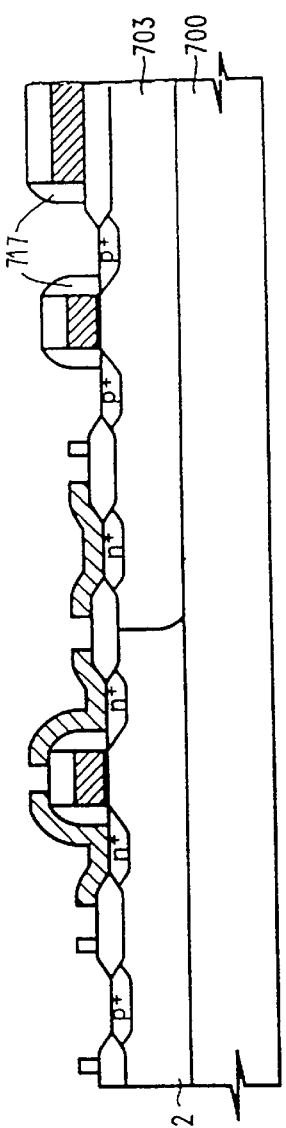
Figure 8E:
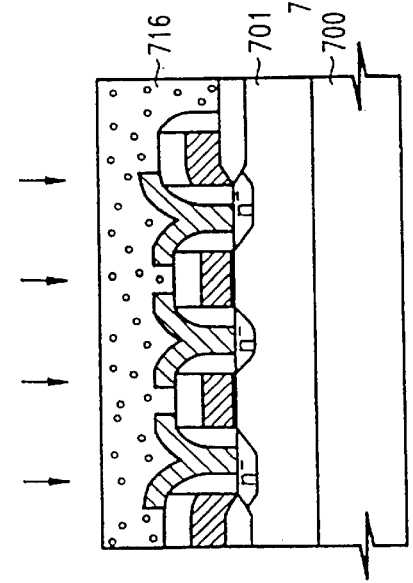
Figure 8F:
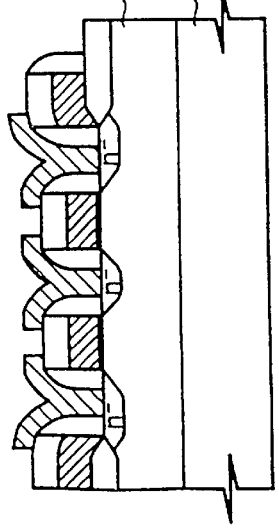

As shown in FIGS. 7E and 8E, third insulating layer 711 formed on the exposed portion is anisotropically etched to form spacer insulating layer 717 on the sidewalls of the respective electrodes and simultaneously to expose the active areas. Using second mask pattern 716, respective spacer insulating layers 717 and cap insulating layer 707 as impurity-implantation preventing masks, p+ impurity is implanted at the dose of $10^{15}–10^{16}$ ions/cm$^2$. As shown in FIGS. 7F and 8F, second mask pattern 716 is removed.

As shown In FIGS. 7G and 8G, a general process is performed to form interlevel dielectric layer 718, bit line 721, interlevel dielectric layers 719 and 723, storage electrode 722 and plate electrode 724 in the cell array portion and to form interlevel dielectric layer 720 and electrode 725 in the peripheral circuit portion.

FIGS. 9A–9G and 10A–10G are sequential cross-sectional views of intermediate structures of the semiconductor device of the present invention, with FIGS. 9A–9G especially showing part of the cell array portion of DRAM and FIGS. 10A–10G showing part of the peripheral circuit portion thereof.

Figure 10A:
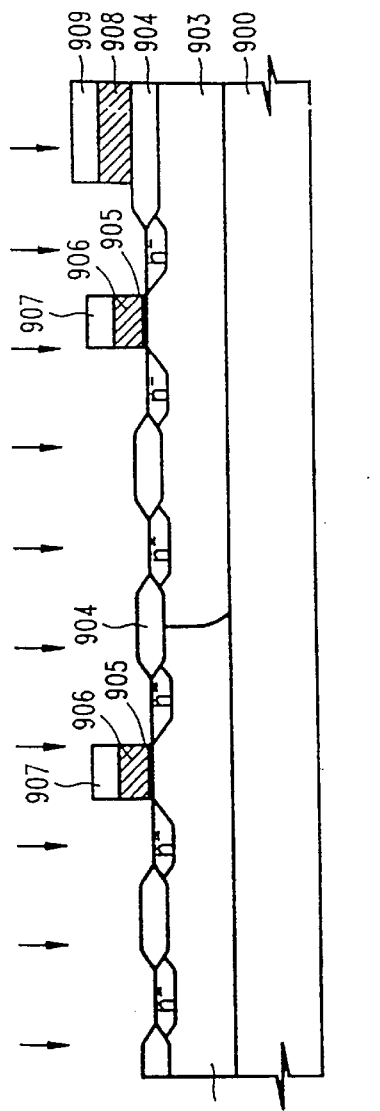
Figure 9A:
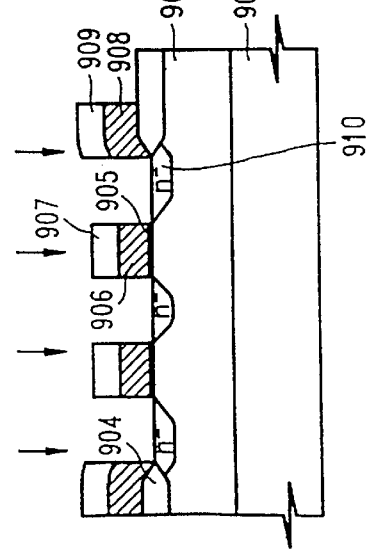

Referring to FIGS. 9A and 10A, a semiconductor substrate 900 is provided, and P-wells 901 and 902 and N-well 903 are selectively formed thereon. Device isolating layer 904 is selectively formed on the respective wells. Subsequently, in order to form gate electrodes and wire electrodes, a first insulating layer of 90–200Å for gate insulating layer 905, and a polysilicon layer of 1,000–2,000Å for gate electrode 906 and wire electrode, are sequentially formed on the overall surface of the resultant structure. An impurity is doped into the polysilicon layer. A second insulating layer of 1,000–2,500Å for forming cap insulating layers 907 and 909 is formed. Then, using gate-mask patterns for defining the respective electrodes, the second insulating layer, the polysilicon layer where the impurity is doped, and the first insulating layer are sequentially and selectively etched. In order to alleviate the device's damage due to succeeding etching and impurity implantation steps, if required, an oxide layer of 50–100Å is formed by thermal oxidation.

Using cap insulating layers 907 and 909 and device isolating layer 903 as impurity-implantation preventing masks, n– impurity of the dose of $1-5\times10^{13}$ ions/cm² is implanted to form a plurality of n– areas 910.

Figure 10B:
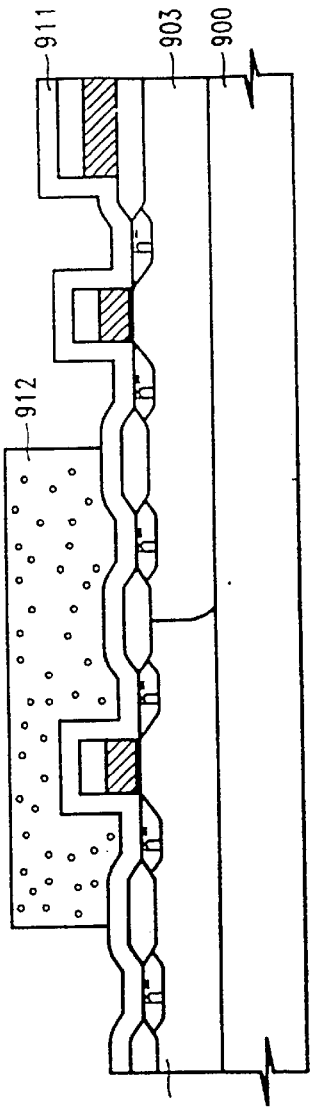
Figure 9B:
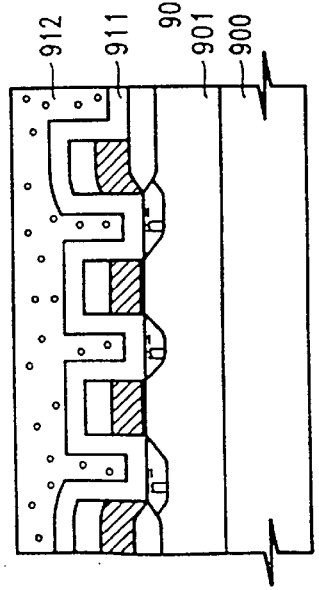

Referring to FIGS. 9B and 10B, a third insulating layer 911 of 2,000Å is formed on the overall surface of the resultant structure, and a first mask pattern 912 for exposing portions for forming the PMOS transistor and P-type area is formed. By doing so, first mask pattern 912 exposes portions where the PMOS transistors and P-type area included in the peripheral circuit portion are formed.

Figure 10C:
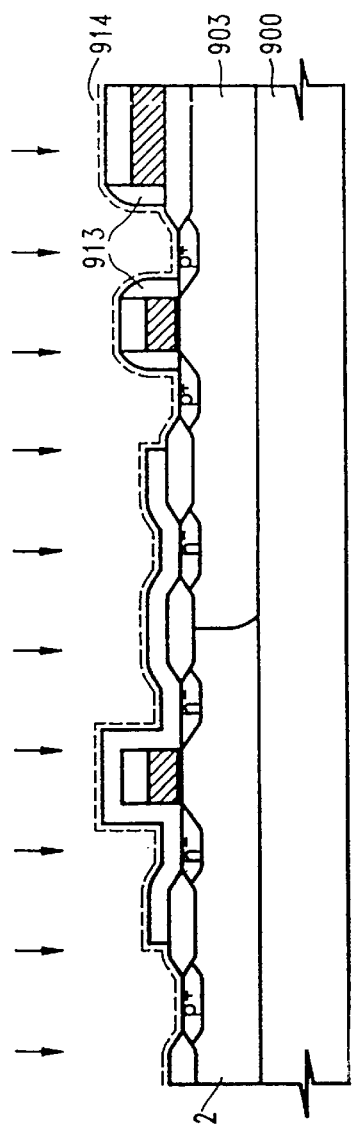
Figure 9C:
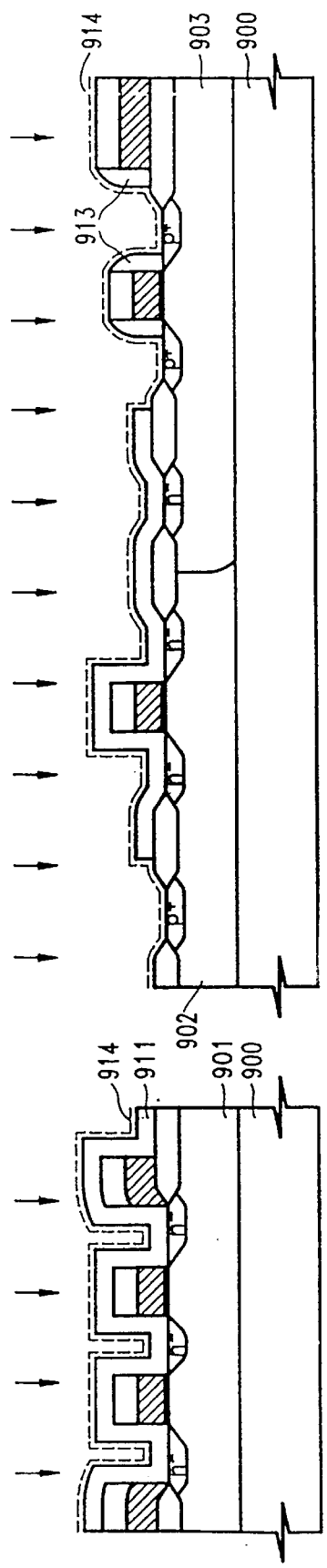

Third insulating layer 911 formed on the portions exposed by first mask pattern 912 is anisotropically etched so that, as shown in FIGS. 9C and 10C, spacer insulating layers 913 are formed on the sidewalls of the respective electrodes formed on the exposed portions and simultaneously active areas are exposed. Then, after removing first mask pattern 912, in order to preclude the device's damage due to a succeeding impurity implantation step, a thermal oxide layer 914 of 50–100Å is formed on the overall surface of the resultant structure.

Using respective spacer insulating layer 913 and cap insulating layer 907 as impurity-implantation preventing masks, p+ impurity is implanted on the overall surface of the resultant structure.

Figure 10D:
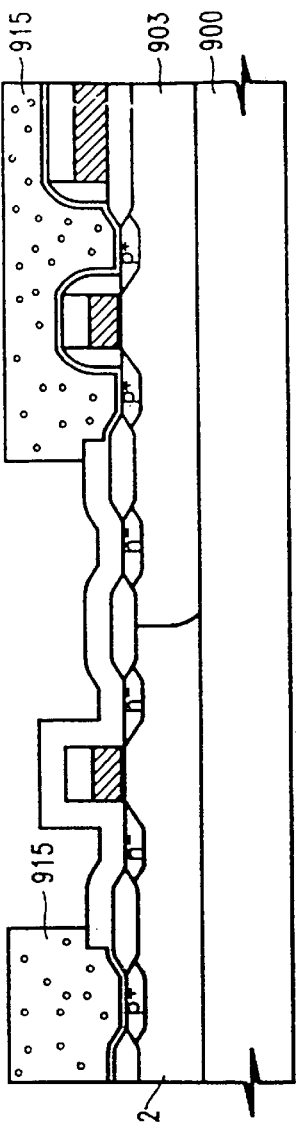
Figure 9D:
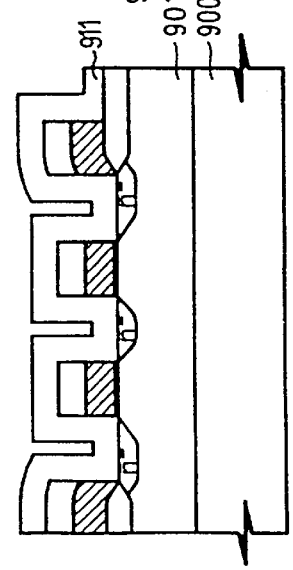

As shown in FIGS. 9D and 10D, a photoresist is coated on the overall surface of the resultant structure and patterned to form a second mask pattern 915 for exposing portions where the NMOS transistor and N-type area are formed.

As shown in FIGS. 9E and 10E, third insulating layer 911 formed on the exposed portion is anisotropically etched so that spacer insulating layer 917 is formed on the sidewalls of the respective electrodes and active areas are exposed. A polysilicon layer 916 of 1,000Å is formed in order to form the connection pad layer on the overall surface of the resultant structure. Third insulating layer 911 and device isolating layer 904 left under polysilicon layer 916 act as impurity-implantation preventing masks in a succeeding n+ impurity implantation step.

After the implantation of n+ impurity, the polysilicon layer 916 is patterned so-that, as shown in FIGS. 9F and 10F, the source/drain area and N-type area of the NMOS transistor are covered and a plurality of connection pad layers 918 for increasing contact margin are formed.

As shown in FIGS. 9G and 10G, a general process is performed to form interlevel dielectric layer 919, bit line 921, interlevel dielectric layers 920 and 923, storage electrode 922 and plate electrode 924 in the cell array portion and to form interlevel dielectric layer 925 and electrode 926 in the peripheral circuit portion.

As described above, the semiconductor device and manufacturing method thereof of the present invention sharply reduces the cost of products and increases productivity.

What is claimed is:

1. A portion of a semiconductor device comprising:
    a semiconductor substrate;
    at least one first conductivity-type area and at least one second conductivity-type area formed on said semiconductor substrate, said first conductivity-type being opposite said second conductivity type;
    a first connection pad layer formed on said first conductivity-type area and on portions of an insulating layer adjacent to said first conductivity-type area to increase a contact margin, said first connection pad layer being patterned such that it is not formed on said second conductivity-type area, and wherein no second connection pad layer is formed on said second conductivity-type area; and
    an interlevel dielectric layer formed over said first and second conductivity-type areas, said interlevel dielectric layer having a first opening disposed over said second conductivity-type area and a second opening disposed over a portion of said first connection pad layer formed on said first conductivity-type area.

2. A semiconductor device as claimed in claim 1, further comprising:
    a first electrode formed on said semiconductor substrate adjacent to said first conductivity-type area; and
    a cover insulating layer formed on said first electrode,
    and wherein said portion of said first connection pad layer formed on said first conductivity-type area extends over a portion of said first electrode, said first electrode being electrically insulated by said cover insulating layer from said first connection pad layer.

3. A semiconductor device as claimed in claim 2, wherein said first electrode is a gate electrode, and said cover insulating layer includes a cap insulating layer formed on said gate electrode and a spacer insulating layer formed on sidewalls of said gate electrode.

4. A semiconductor device as claimed in claim 1, further comprising second electrodes which are respectively connected to said first connection pad layer and said second conductivity-type area through said first and second openings.

5. A semiconductor device as claimed in claim 1, wherein said first connection pad layer is made of polysilicon which is doped by a first conductivity-type impurity.

6. A semiconductor device as claimed in claim 4, wherein said second electrodes are made of metal.

7. A semiconductor device comprising:
    a semiconductor substrate;
    at least one first conductivity-type MOS transistor having:
        first conductivity-type source and drain areas separately formed on said semiconductor substrate,
        a gate insulating layer formed on said semiconductor substrate between said source and drain areas, and
        a gate electrode formed on said gate insulating layer;
    a gate cover insulating layer formed over said gate electrode of said first conductivity-type MOS transistor;
    a first connection pad layer formed on said source area and a first portion of said gate cover insulating layer of said first conductivity-type MOS transistor;
    a second connection pad layer formed on said drain area and a second portion of said gate cover insulating layer of said first conductivity-type MOS transistor, said second connection pad layer being electrically insulated from said first connection pad layer;
    at least one second conductivity-type MOS transistor, said second conductivity-type being opposite said first conductivity-type, said second conductivity-type MOS transistor having:
        second conductivity-type source and drain areas separately formed on said semiconductor substrate, a gate insulating layer formed on said semiconductor substrate between said source and drain areas, and a gate electrode formed on said gate insulating layer, said first and second connection pad layers being patterned such that they are not formed over said second conductivity-type MOS transistor, and wherein no third connection pad layer is formed on said source and drain areas of said second conductivity-type MOS transistor;

an interlevel dielectric layer having openings respectively disposed over said first and second connection pad layers and said source and drain areas of said second conductivity-type MOS transistor; and electrodes respectively connected to said first and second connection pad layers and said source and drain areas of said second conductivity-type MOS transistor through said openings.

8. A semiconductor device as claimed in claim 7, wherein said first and second connection pad layers are made of polysilicon which is doped by a first conductivity-type impurity.

9. A semiconductor memory device comprising:

a semiconductor substrate;

a cell array portion including:
  a plurality of first conductivity-type transistors each having a source area, a drain area and a gate, and
  a plurality of first conductivity-type connection pad layers formed on said source and drain areas of said first conductivity-type transistors to increase a contact margin;

a peripheral circuit portion including:
  a plurality of first and second conductivity-type transistors, said first conductivity-type being opposite said second conductivity-type, said transistors each having a source area, a drain area and a gate, and
  a plurality of first conductivity-type connection pad layers formed on said source and drain areas of said first conductivity-type transistors to increase a contact margin, and wherein no second connection pad layers are formed on said source and drain areas of said second conductivity-type transistors; and an interlevel dielectric layer formed over said cell array and said peripheral circuit portions, said interlevel dielectric layer having a plurality of first openings respectively disposed over said first conductivity-type connection pad layers of said cell array and said peripheral circuit portions and a plurality of second openings respectively disposed over said source and drain areas of said second conductivity-type transistors of said peripheral circuit portion.

10. A semiconductor device as claimed in claim 9, wherein said first conductivity-type transistors in both said cell array portion and peripheral circuit portion are NMOS transistors having a lightly-doped-drain structure.

11. A semiconductor device as claimed in claim 9, wherein said second conductivity-type transistors in said peripheral circuit portion are PMOS transistors.

12. A semiconductor memory device comprising:

a cell array portion;

a peripheral circuit portion, including:
  a semiconductor substrate;
  at least one first conductivity-type area and at least one second conductivity-type area formed on said semiconductor substrate, said first conductivity-type being opposite said second conductivity-type;
  a connection pad layer formed on said first conductivity-type area and on portions of an insulating layer adjacent to said first conductivity-type area to increase a contact margin, while there is no connection pad layer formed on said second conductivity-type area; and
  an interlevel dielectric layer formed over said first and second conductivity-type areas, said interlevel dielectric layer having a first opening disposed over a portion of said connection pad layer formed on said first conductivity-type area and a second opening disposed over a portion of said second conductivity-type area that completely exposes said portion of said second conductivity-type area.

13. A semiconductor memory device as claimed in claim 12, further comprising:

a first electrode formed on said semiconductor substrate adjacent to said first conductivity-type area; and a cover insulating layer formed on said first electrode, and wherein said portion of said connection pad layer formed on said first conductivity-type area extends over a portion of said first electrode, said first electrode being electrically insulated by said cover insulating layer from said connection pad layer.

14. A semiconductor memory device as claimed in claim 12, further comprising second electrodes which are respectively directly connected to said connection pad layer and said second conductivity-type area through said first and second openings.

15. A semiconductor memory device as claimed in claim 12, wherein said connection pad layer is made of polysilicon which is doped by a first conductivity-type impurity.

16. A semiconductor memory device as claimed in claim 13, wherein said first electrode is a gate electrode, and said cover insulating layer includes a cap insulating layer formed on said gate electrode and a spacer insulating layer formed on sidewalls of said gate electrode.

17. A semiconductor memory device as claimed in claim 14, wherein said second electrodes are made of metal.

\* \* \* \* \*